United States Patent
Winstead et al.

(10) Patent No.: US 7,062,410 B2
(45) Date of Patent: Jun. 13, 2006

(54) TRANSISTOR PERFORMANCE ANALYSIS SYSTEM

(75) Inventors: Charles H. Winstead, Portland, OR (US); Yiqing Zhou, Portland, OR (US); Carrie Auyeung, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 10/874,395

(22) Filed: Jun. 23, 2004

(65) Prior Publication Data

US 2005/0288899 A1 Dec. 29, 2005

(51) Int. Cl.
*G06F 11/30* (2006.01)
*G06F 17/50* (2006.01)

(52) U.S. Cl. .......................................... 702/183; 716/4
(58) Field of Classification Search ................ 702/183, 702/182; 715/503, 538; 703/22; 716/4; 707/1

See application file for complete search history.

(56) References Cited

U.S. PATENT DOCUMENTS

| | | | | | |
|---|---|---|---|---|---|
| 5,768,144 | A | * | 6/1998 | Nagase ........................... | 716/4 |
| 6,362,013 | B1 | * | 3/2002 | Yoshimura .................... | 438/14 |
| 6,401,235 | B1 | * | 6/2002 | Ashida ......................... | 716/19 |
| 6,625,785 | B1 | * | 9/2003 | Chatterjee et al. ............. | 716/4 |
| 2002/0069396 | A1 | * | 6/2002 | Bhattacharya et al. ......... | 716/7 |

OTHER PUBLICATIONS

ReliaSoft, Weibull ++ Version 6, Apr. 8, 2003, www.reliasoft.org/pubs/weibull_brochure.pdf.*
Johnson, Jr. et al., Survey of Software Tools for Evaluating Reliability, Availability, and Serviceability, Dec. 1988, ACM Computing Surveys, vol. 20, No. 4, pp. 227-269.*
Sischka, F., Professional Software Tools for Device Modeling, 8th International Conference MIXDES 2001, pp. 1-5.*
Obermeier, Fred, A Model Generation and Compilation System for Improving Electrical Performance, 1990 IEEE, pp. 852-855.*

* cited by examiner

*Primary Examiner*—Bryan Bui
*Assistant Examiner*—Toan M. Le
(74) *Attorney, Agent, or Firm*—Carrie A. Boone, P.C.

(57) ABSTRACT

A system for conducting transistor performance analysis is disclosed, in which automatic graph plotting is interactively enhanced with human judgment. The system includes executing transistor performance analysis software, which receives templates specifying parameters, graph charting options, and algorithms, as well as a database of transistor values, as its inputs. The software produces an output document with linked graphs and a summary report. The software extracts, filters and applies statistical regression to large quantities of data. The software also applies statistical filtering to the data and automatically plots hundreds of charts and graphs based on the data. Graphs are color-coded to highlight relationships that suffer from unusually high noise in the data. Users can manually adjust lines on the graphs, which are automatically reflected in dependent graphs and the summary report. Changes to program methodology can be achieved by changing the template rather than by modifying the software.

36 Claims, 10 Drawing Sheets

TRANSISTOR PERFORMANCE ANALYSIS SYSTEM

FIELD OF THE INVENTION

This invention relates to semiconductor production, and, more particularly, to a software program that automates transistor performance analysis.

BACKGROUND OF THE INVENTION

Typically, every process generation of semiconductor technology development involves a shrink in the physical dimensions of the manufacturing process and a redesign of the base architecture of the transistor. At the onset of a new technology, electrical and physical constraints are determined, to which the entire manufacturing process conforms.

A primary challenge within each technology is to ascertain the optimal transistor architecture within the ranges of the electrical and physical constraints that produces the best combination of performance and manufacturability. In addition to shrinking the transistors (replacing a 0.15-micron process with a 0.10-micron process, for example), improvements in transistor switching performance, improved drive current, and reduced leakage current are among the goals. Although minor revisions to the process occur as well, major revisions typically feature performance improvements of up to 30% or more.

Prototype transistor architectures are manufactured in lots across varying geometries and processing values. A lot may include twenty-five wafers, manufactured according to different process variations, or recipes. Some wafers are processed at higher energy, some at higher temperature, and so on. Thousands of parameters, both physical and electrical, are collected for each wafer. By varying the recipes for manufacturing the wafers, the data obtained may be analyzed to determine which process variation results in the best overall transistor performance.

A critical path in transistor optimization is the data analysis time. In the early phases of technology development, the data collected is prone to large variations, both within the wafer and across other wafers in the lot. For example, data measurements for the capacitance, the drive current, or the leakage current of various circuits may be obtained. The significant variations in data make it difficult to effectively analyze the large volume of data.

During transistor optimization, there exist several challenges in analyzing the data. First, it is difficult to efficiently extract, filter, and align the large volume of data, which includes both electrical and physical characteristics. For example, one analysis includes 250 sets of die-level parameters across a run of twenty-five wafers (one lot), resulting in over 100,000 data points. The data is extracted manually, such as by using a search query language, then aligned manually using interactive statistical software. In another analysis, custom scripting automates the data extraction process.

Second, the data analysis involves the plotting of key parameters. The typical process generation includes forty graphs or plots per wafer, for a total of 1000 plots per run. Interactive statistical software may be used, along with manual interaction, to generate operating graphs one-by-one. In some cases, custom scripting may help to automate the process of creating the graphs. A highly trained engineer visually inspects each graph and manually correlates key parameters between graphs, a time-consuming procedure.

Data analysis also involves filtering and applying statistical algorithms to the collected data. Statistical techniques, such as regression analysis, are used to evaluate the relationship between various parameters, producing representative equations of the parameter relationships. There may be 1000 equations per run, as one example. Interactive statistical software, along with manual interaction, may be used to apply filtering and regression algorithms to each graph.

Using judgment obtained through experience, the highly trained engineer next adjusts the graphs, such as to remove noisy data. The engineer may also adjust an intercept point on a graph, if needed. Further, the engineer must identify all other graphs which may be affected by the adjustment (such as graphs plotting an affected parameter), and manually modify each of the dependent graphs as well. This expert-driven and time-consuming aspect of the analysis traditionally impedes automation.

The expert engineer also identifies data collection problems. A good engineer is quickly able to identify data extraction errors, for example, such as data that results from a bad probe of the wafer. A typical run of 100,000 data points may include 500 data collection problems, as one example.

The data analysis next includes determining parametric values at the boundaries of the range of the key operating constraints. For example, the process may be constrained to produce transistors whose threshold voltages are within a preset range. The analysis determines the parametric values that correspond to the maximum and minimum allowable threshold voltages. There may be a thousand parametric values per run, as one example. Typically, this step is performed using interactive statistical software, with manual intervention, to overlay boundaries of operating constraints and determine interception with data equations. Intercepts are calculated on a plot-by-plot basis, since the intercepts of one plot are used to determine the intercepts on the next plot.

Finally, the data analysis of any process generation depends on keeping up with an ever-changing transistor analysis methodology. Typically, methodologies change three to four times each year. Without being able to change parametric models and key parameters efficiently, the analysis quickly becomes stale. Currently, data analysis employs manual data collection and correlation (such as using a structured query language) and interactive statistical software. When a change in the parametric model occurs, the current data analysis paradigm is not capable of adapting automatically.

Data analysis of a process generation may be scripted to extract the data and produce the graphs. The graphs are then printed, and one or more engineers visually review each graph. Points of intercept between the constraints and the performance curved are typically determined during this manual visual inspection. Statistical algorithms that lack the capability to adjust with engineering judgment are not typically used for such data analysis because of the variation in the data obtained during technology development.

The above data analysis takes a highly trained engineer approximately one week, by one estimate, to complete the analysis. The process does not easily adapt to changes in data or in the desired analysis methodology. Further, the process is not automatic, as it includes a significant amount of manual interaction with the software programs.

Thus, there is a continuing need to develop a system for performing data analysis of a process generation that overcomes the shortcomings of the prior art.

DETAILED DESCRIPTION

In accordance with the embodiments described herein, a system is disclosed for efficiently and automatically conducting transistor performance analysis. The system includes a transistor performance analysis software program, which takes as inputs a specification from the user of an analysis template and the material to be analyzed. The analysis template describes the parameters to be extracted and the analyses to be performed. The software extracts the values of the parameters obtained during testing of the transistors, and produces an output document with linked graphs that is suitable for performing interactive analysis, as well as a summary document following the analysis.

The transistor performance analysis software produces hundreds of linked, interactive graphs based on the chosen template, which specifies parameters, charting options, and algorithms used to generate the graphs. In some embodiments, 500 sets of data, including 500 graphs, are generated from 100,000 data points in under three minutes.

Graphs are color-coded to highlight relationships that suffer from unusually high noise in the data. Engineers can manually adjust predetermined parameters on the graphs, according to their expert judgment. Once a parameter on one graph is adjusted, the change is automatically replicated in dependent graphs. When the manual adjustment is complete, the software produces a summary report that assembles relevant information for each graph.

The user-configurable template specifies the parameters to be extracted, the grouping and filtering to be applied, the regression algorithms to be used, and the multi-graph linking to be enforced. Changes to the specific methodology of the transistor performance analysis software can thus be implemented by changing the template, rather than by modifying the software.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
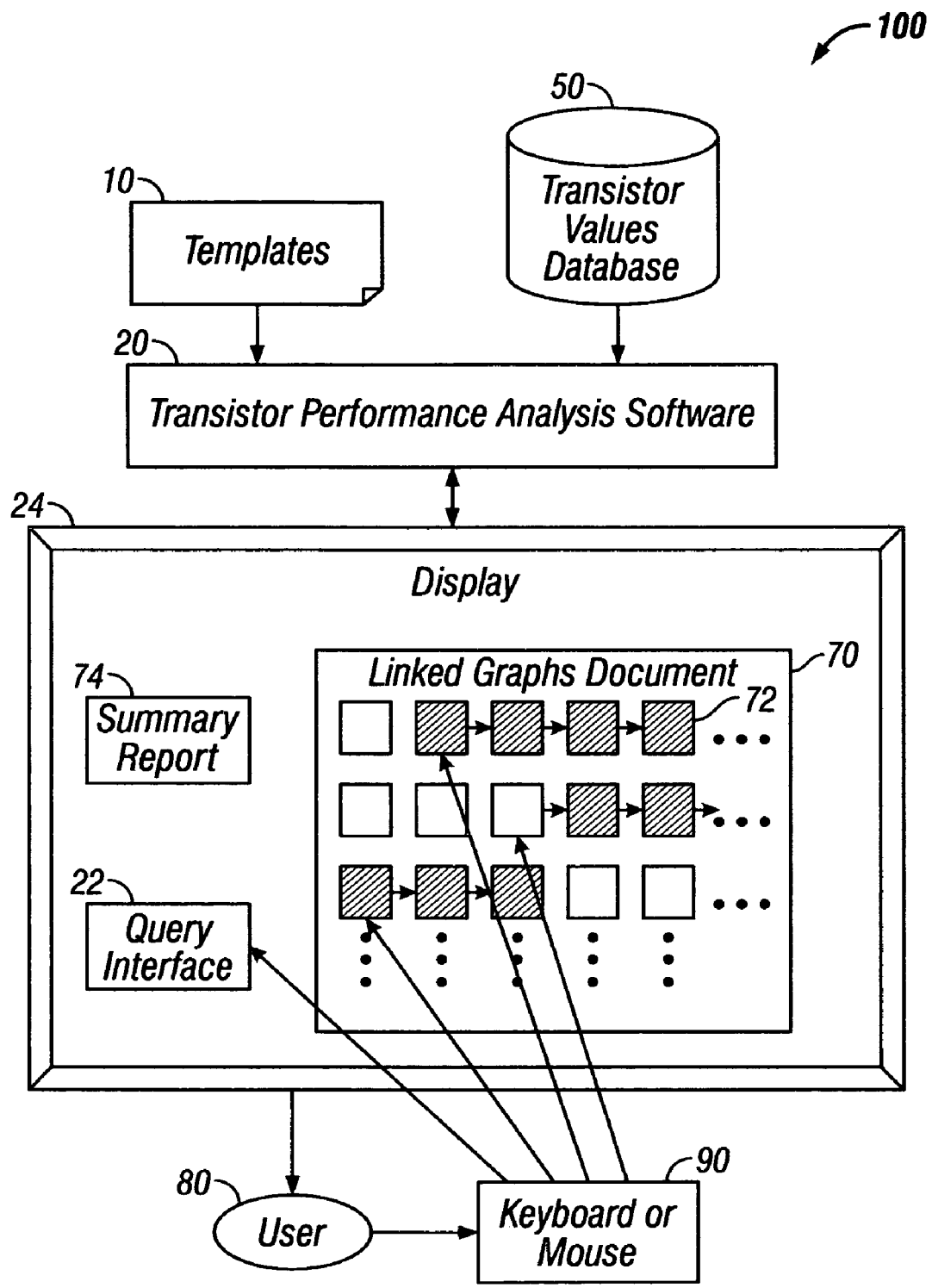
FIG. 1 is a block diagram of a system using transistor performance analysis software, according to some embodiments.

With reference to FIGS. 1–5, several block diagrams depicting a system 100 for performing transistor performance analysis are shown, according to some embodiments. In FIG. 1, the system 100 uses a transistor performance analysis software program 20 (hereinafter, software 20), to produce an output document with linked graphs 70, with which a user 80 may manipulate the data interactively. In some embodiments, the system 100 improves the speed of determining an optimal process for transistor manufacturing using a streamlined end-to-end application (the software 20) that extracts, correlates, plots, and summarizes the data.

Figure 3:
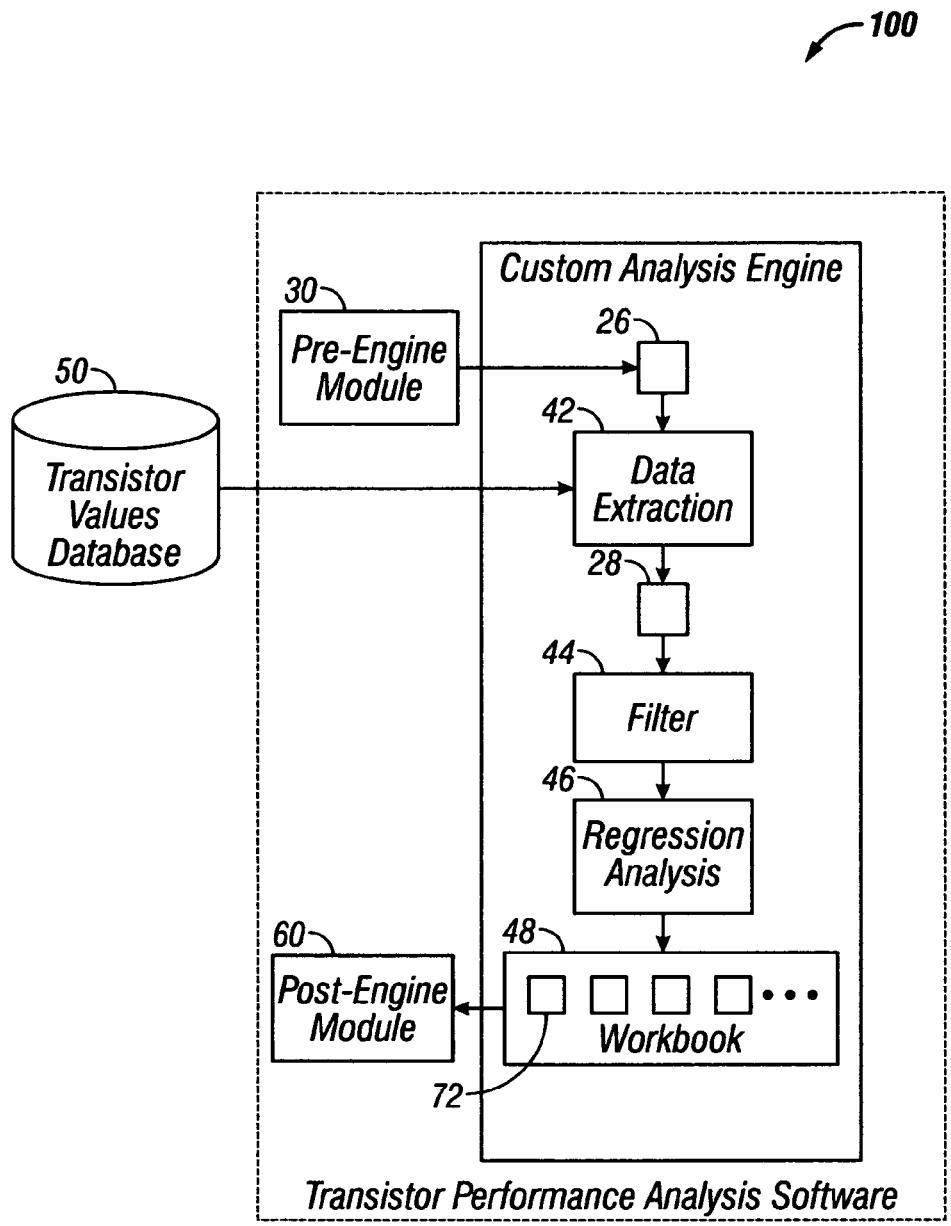
FIG. 3 is a block diagram of the custom analysis tool of the transistor performance analysis software of FIG. 1, according to some embodiments.
Figure 4:
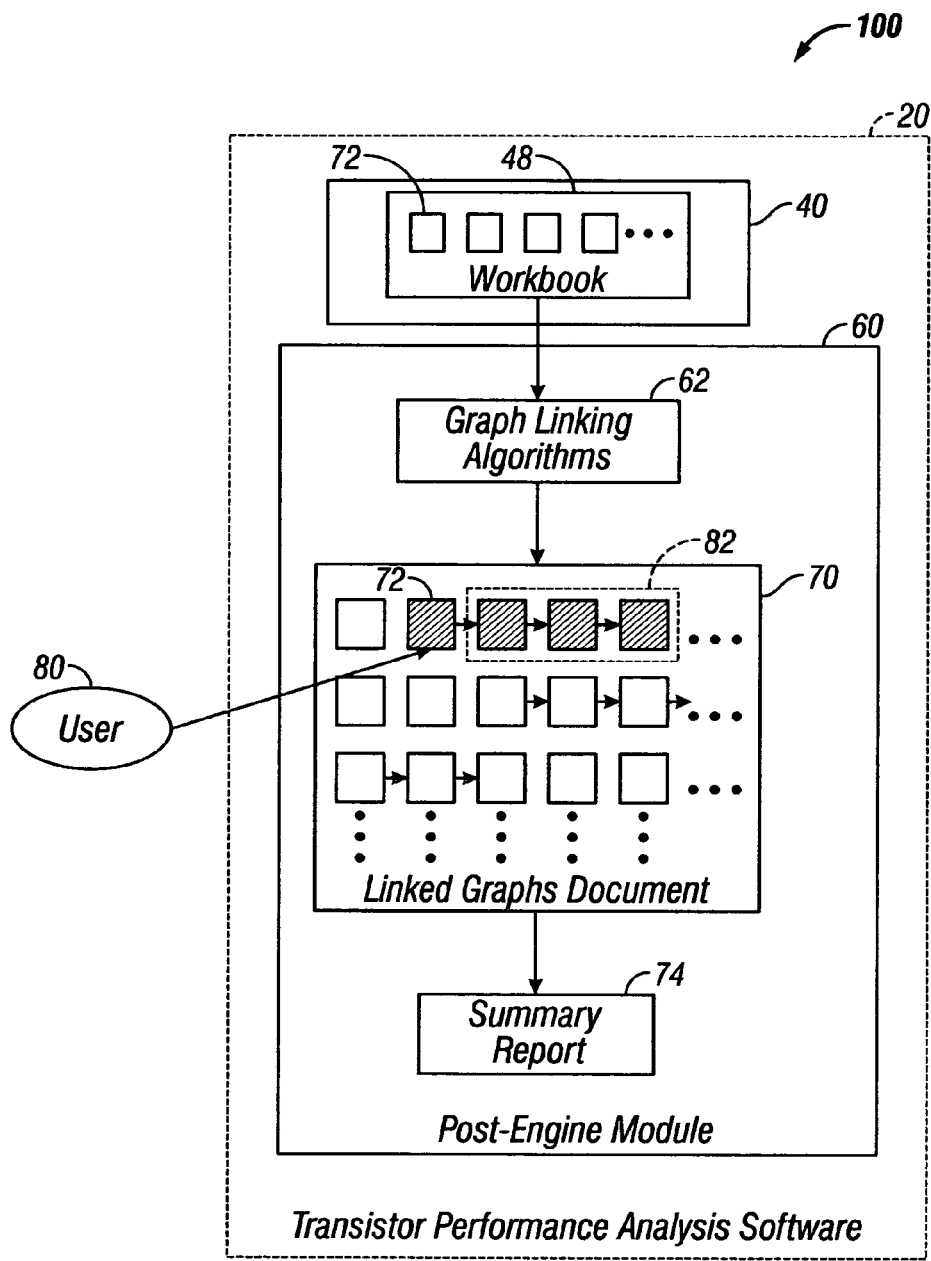
FIG. 4 is a block diagram of the post-engine module of the transistor performance analysis software of FIG. 1, according to some embodiments.

The software 20, which may be loaded into a processor-based system, includes a pre-engine module 30 (FIG. 2), a custom analysis engine 40 (FIG. 3), and a post-engine module 60 (FIG. 4). The software 20 produces the linked graphs document 70 based on user-definable templates 10, empirically obtained transistor parameter values 50, and responses obtained from the user 80 during presentation of a query interface 22.

The linked graphs document 70 includes a number of interactive graphs 72, any of which may include an adjustable variable 78 (FIG. 5), which may be modified by the user 80. A change to the adjustable variable 78 is visible in the graph 72, and is further reflected in linked graphs. Once adjustments to the graphs 72 are complete, the transistor performance analysis software 20 produces a summary report 74 that includes information from each graph 72. The linked graphs document 70 and the summary report 74 are visible on a display 24, such as a video monitor. The user 80 interactively manipulates the linked graphs document 70 using an input device such as a keyboard or mouse 90.

As another option, the software 20 may produce graphs 72 that are not linked to one another. These graphs share the feature-rich capability of their linked counterparts. Unlinked graphs can be user-adjusted, such as to exclude noisy data, and can be included in the summary report.

In some embodiments, the software 20 uses an electronic spreadsheet program, such as Excel, and Visual Basic for Applications (VBA) as a front-end for easy integration with the native charting capability provided by Excel. The custom analytical engine 40 is implemented as a custom dynamically linked library (DLL), written with Visual C++, and integrated into Excel. (Excel, Visual Basic for Applications, and Visual C++ are products of Microsoft Corporation of Redmond, Wash.)

Figure 2:
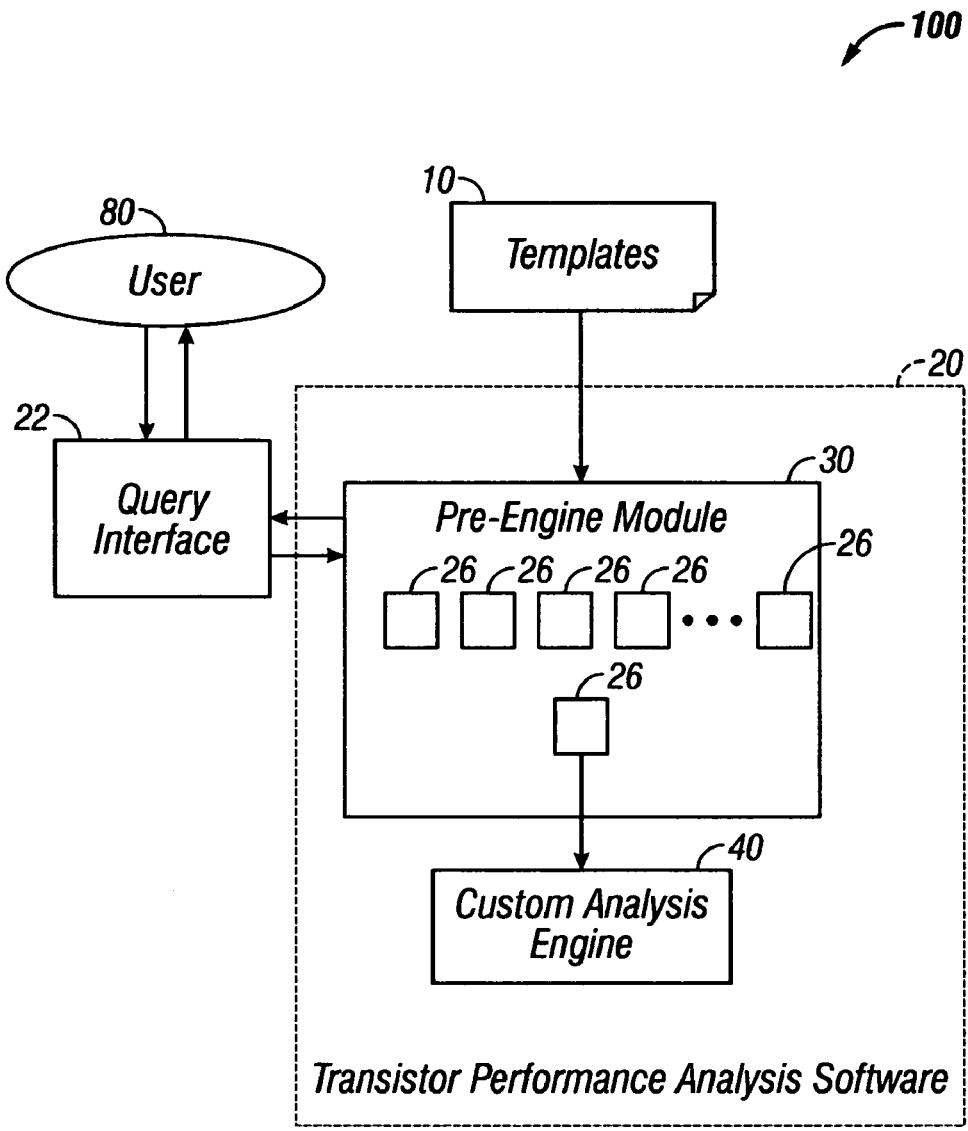
FIG. 2 is a block diagram of the pre-engine module of the transistor performance analysis software of FIG. 1, according to some embodiments.

In FIG. 2, the pre-engine module 30 is depicted. In some embodiments, the pre-engine module 30 employs scripts, written in VBA. The pre-engine module 30 accepts the templates 10 as inputs. The templates 10 specify parameters, graph charting options, and algorithms to be used by the custom analysis engine 40. The templates 10 include voltage, current, resistance, and capacitance parameters, as well as N- and P-type parameters, for example. The templates 10 also specify the filtering and statistical analysis methods to be used by the custom analysis engine 40.

In addition to the templates 10, the pre-engine module 30 also interactively obtains information from the user 80. In some embodiments, the pre-engine module 30 presents a query interface 22, such as a graphical user interface displayed on the video monitor 24, to obtain the user input. The query interface 22 may, for example, prompt the user 80 to supply the relevant material, such as the wafers or lot designated to undergo the current analysis. The lot selection parameter may specify "lot A," for example, such that the twenty-five wafers in the first lot are subject to the analysis. Where multiple sets of templates are available, the query interface 22 may further prompt the user 80 to specify which templates to use. The system 100 may include a keyboard or pointing device 90, with which the user supplies the responses to the queries.

Once the requested information is obtained from the user 80, the pre-engine module 30 assembles the template information, to produce a number of analysis units 26, depicted in FIG. 2. Each analysis unit 26 includes the parameters, graph charting options, and algorithms used to produce a graph. Once the parameter values 50 are obtained (by the custom analysis engine, described below), the analysis units 26 will be plotted as graphs. The analysis units 26, of which there may be hundreds, are passed on to the custom analysis engine 40 of the transistor performance analysis software 20.

The pre-engine module 30 obtains the template information using a series of dialogs, in some embodiments, such that an Excel workbook containing the analysis units 26 can be specified (by the custom analysis engine). The pre-engine module 30 thus gathers the parameters, graph charting features, and algorithms into the analysis units 26, then calls the custom analysis engine 40.

As depicted in FIG. 3, the custom analysis engine 40 receives the analysis units 26 from the pre-engine module 30. In some embodiments, the custom analysis engine 40 is a DLL engine. A data extraction module 42 extracts transistor parameter values 50 from a database. The database stores transistor parameter values obtained empirically during testing of the material. By plugging the values 50 into the analysis units 26, graphs 28 are produced.

Figure 5:
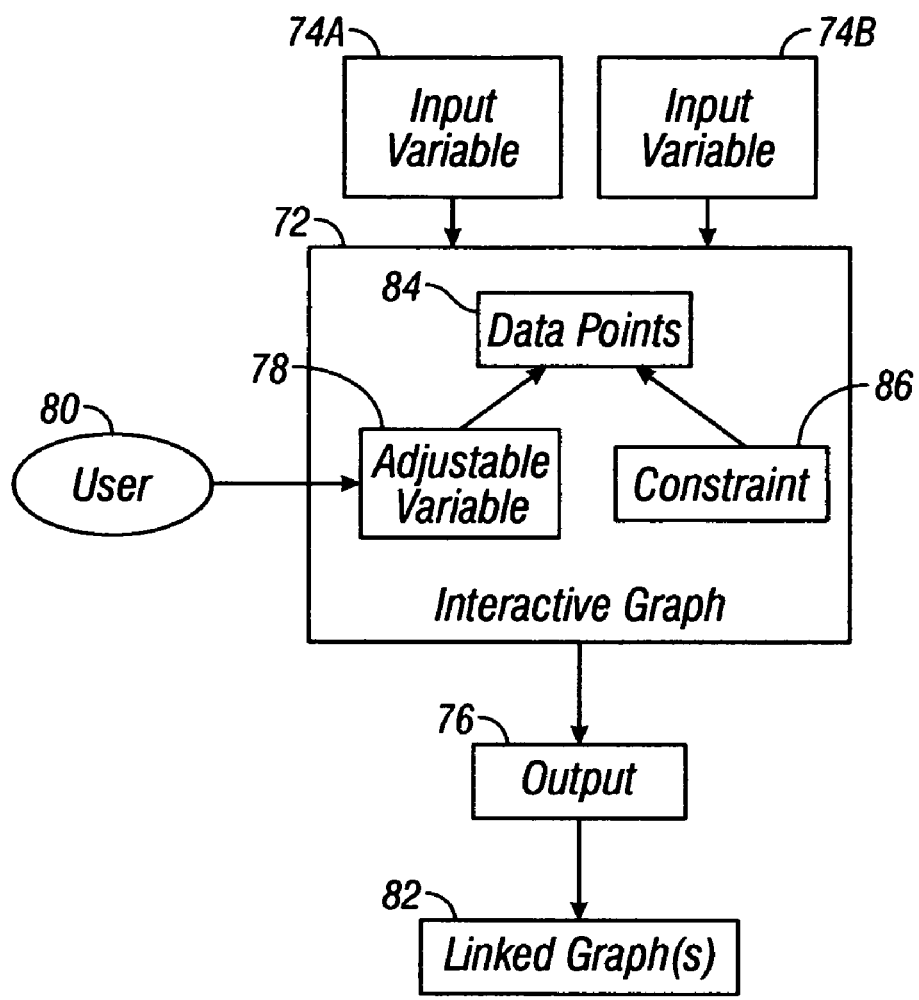
FIG. 5 is a block diagram of a user-adjustable graph produced by the transistor performance analysis software of FIG. 1, according to some embodiments.
Figure 6:
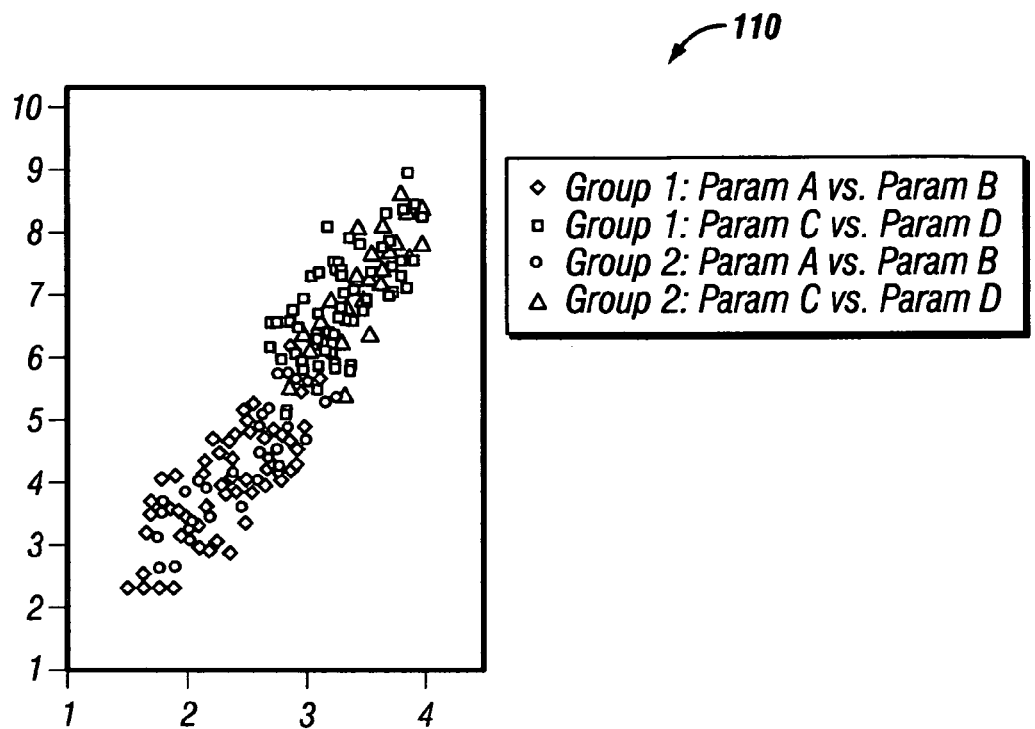
FIG. 6 is graph showing data extraction and grouping by the transistor performance analysis software of FIG. 1, according to some embodiments.

The graphs 28, which are derived from template parameters, empirically obtained parameter values, and responses to user queries, are ready for analysis by the custom analysis engine 40. As schematically represented in FIG. 5, each graph 28 includes a number of data points 84, and may include other features, as described below.

The custom analysis engine 40 includes a filtering module 44 and a regression analysis module 46. The filter 44 may perform simple filtering on the graph 28, in which data outside a predetermined range of values (known as an outlier) is discarded. Or, the filter 44 may perform more complex filtering, such as using statistical filtering techniques. The filtering technique to be used may have been specified in the templates 10, and is thus one of the parameters encapsulated in the graph 28.

The regression analysis module 46 performs regression analysis on the graph 28. Regression analysis involves fitting a formula or equation to the data points 84 of the graph. Again, the templates 10 may specify the type of regression analysis to be used on the graph 28. Once the regression analysis is complete, a result graph 72 is produced, and the custom analysis engine 40 stores the result graph 72 in one or more worksheets, which may be assembled into a workbook 48, as depicted in FIG. 3. In some embodiments, the workbook 46 is generated using the functions in xlcall32.dll, which is distributed with Excel.

The post-engine module 60 is depicted in FIG. 4, according to some embodiments. The post-engine module 60 produces the linked graphs document 70, based on graph-linking algorithms 62, which are specified in the templates 10, and are thus encapsulated in each graph 72. In some embodiments, the linked graphs document 70 includes a number of rows of graphs 72, in which linking is established between graphs in a row. Not all graphs 72 in the document are linked. Because of the linkages between graphs 72 in the document 70, an adjustment to a single graph is reflected in other, dependent graphs, as described below. Thus, once the linked graphs document 70 is created, the user 80 may interact and, in essence, adjust or override the prior automatic analysis of the data that was performed by the software 20.

In FIG. 5, the graph 72 produced by the transistor performance analysis software 20 is depicted schematically. The graph 72 includes a plurality of data points 84 that are to be plotted on an X-Y coordinate system (not shown). The graph 72 receives an input variable 74A and an input variable 74B (collectively, input variables 74) and produces an output 76. The graph 72 may further include an adjustable variable 78, which is accessible to the user 80, and a constraint 86. The transistor performance analysis software 20 may produce one thousand or more graphs, not all of which will include an adjustable variable or a constraint. The output 76 of the graph 72, or parent graph, is connected to one or more linked (child) graphs 82 (see also FIG. 4).

When the adjustable variable 78 is modified by the user 80, the output 76 may also change. The output may be the variable itself, or may be affected by a change in the variable. The linked graphs 82 are graphs that include either the; adjustable variable 78 or the output 76. When a change to the adjustable variable 78 is made by the user 80, the linked graphs 82 automatically are updated by the software 20 to reflect the change. In this manner, the user 80 can focus on initial graphs in a stream of linked graphs, knowing that subsequent (child) graphs will automatically reflect the modification of the initial (parent) graph.

The graph 72 may also include one or more constraints 86. The constraint 86 may be a preferred value for one of the input variables or may specify a particular target value, based on design rules for the transistors. Or, the constraint 86 may result from manipulation of a previous (parent) graph. The input variables 74, the adjustable variable 78, and the constraint 80 are specified for the particular graph 72 in the templates 10.

Graphs 72 featuring input variables 74, adjustable variables 78, constraints 86, and outputs 76 are depicted in FIGS. 6, 7, 8A–8C, and 9, which are described in more detail, below.

Data Extraction and Grouping

The transistor performance analysis software 20 enables the user 80 to customize the graphs used in the analysis according to material/parameter overlay options. As one example, in FIG. 6, a graph 110 depicts a correlation of parameters A and B (diamonds) and a correlation of parameters C and D (squares), organized by a first material grouping, such as a first wafer in a lot (group 1). The graph 110 also depicts a second material, or wafer, grouping (group 2), which depicts a correlation of parameters A and B (circles) and a correlation of parameters C and D (triangles). Comparisons of two identical parameters, for two different wafers, are thus obtained and plotted on a single graph. The group 2 data (circles and triangles) are overlayed upon the group 1 data (diamonds and squares).

Statistical Filtering and Regression

Figure 7:
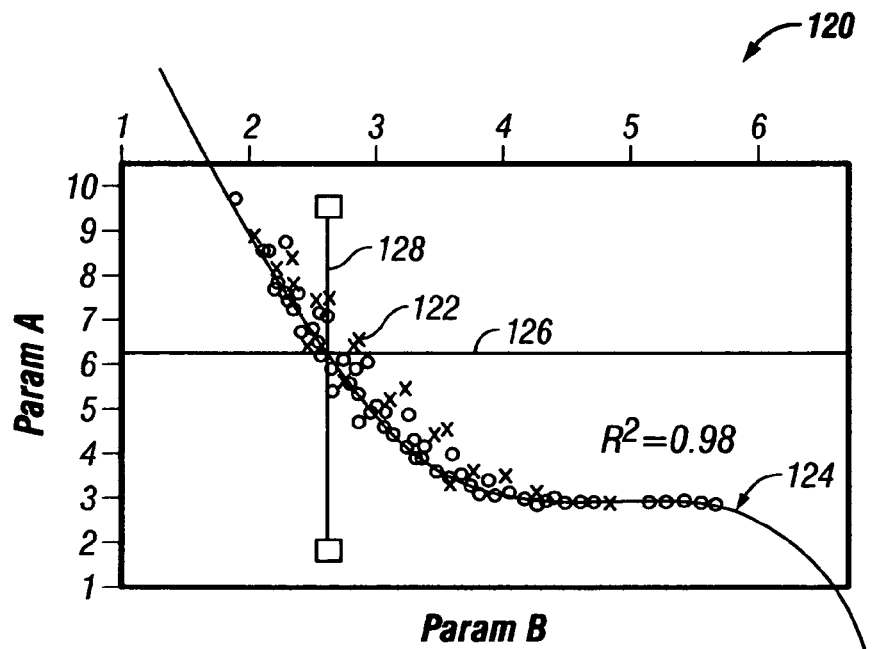
FIG. 7 is a graph showing the filtering and regression analysis performed by the transistor performance analysis software of FIG. 1, according to some embodiments.

The templates 10 received by the pre-engine module 30 specify parameters, graph charting features, and algorithms. The templates 10 enable the user 80 to specify graphs that include multiple data sets collected from devices of varying sizes. For example, FIG. 7 depicts a graph 120, which plots parameter A versus parameter B to produce data points 122. Here, the template 10 specifies that the graph 120 plots parameter A versus parameter B, in which these parameters have been collected across varying devices.

In some embodiments, the custom analytical engine 40 performs a two-pass filtering algorithm on the data points 122 in the graph 120. The first pass filter removes data from the graph, and determines valid limits of the graph. The second pass filter removes statistical outlier data points from the regression analysis. These removed data points 122 remain on the graph, but are changed from o's to x's. (Note that the data points untouched by the second pass filter are o's.) By continuing to include the filtered out data points on the graph 120, the user 80 can consider both the x's and the o's when interactively changing the adjustable parameter without having the outlier data (x's) influence the regression analysis.

Next, the regression analysis is performed. In FIG. 7, the filtered out data points 122 are shown as x's, a parametric equation 124 is depicted as a solid curve on the graph 120. The parametric equation 124 is a formulaic representation of the non-filtered data points, or o's of the graph 120.

A reference line 126, a horizontal line, is also shown in FIG. 7. The line 126, which is colored red in some embodiments, may be one of the parameters from the templates 10 that specifies a target value, based on particular design rules for the transistors. Or, the line 126 may result from manipulation of a previous (parent) graph. The software 20 plugs the parameter A value (at the reference line 126) into the parametric equation 124, to determine the parameter B value at the intersection point on the graph 120. The parameter B value is known as the intercept, and is depicted as a vertical line 128 in FIG. 7.

The intercept 128 could be determined manually, by visually inspecting the data points 122 on the graph. Thus, for example, where parameter A is 6.2, the o's of the data points could be inspected to arrive at a parameter B value of 2.8. However, there may be multiple o's at the location where parameter A is 6.2. By plugging the parameter A value into the parametric equation 124, the software 20 automatically produces a parameter B value result, which is the intercept 128.

In the graph 120, parameter B (intercept 128) is an adjustable parameter. In some embodiments, the vertical line, or intercept 128 is color-coded to be visually distinct from the other features on the graph. In some embodiments, this color-coding identifies user-adjustable features of the graph 120. The intercept 128 may be moved to the left or to the right along the graph 120 (although the intercept remains vertical). In FIG. 7, the intercept 128 includes end markers, to denote the adjustability of the parameter. FIGS. 8A–8C and 9A–9B similarly include end markers to denote the adjustable parameter within each graph.

The manual modification of the adjustable parameter (in this case, the intercept 128) enhances the capability of the software 20 by allowing the judgment of the user 80 (human judgment) to be smoothly integrated into the analysis. The display of the outlier data points enables the user 80 to conduct further investigations into the cause and effect of the outlier data. For example, the user 80, who is often an expert in such analysis, may inspect the graph 120 in FIG. 7 and realize that some of the data points that were filtered out (shown as x's) are actually important to the analysis. (This is also a reason for maintaining a distinct graphical representation of the filtered out data points, as compared to the remaining data points, rather than removing them from the graph entirely.) Or, the user 80 may realize that mis-probing occurred during empirical testing, such that some of the data is tainted. Thus, in contrast to other schemes for automating analysis, expert judgment is exploited by the software 20 by allowing the user 80 to modify one of the parameters of the graph 120. Further, the software 20 facilitates allowing the user 80 to make such adjustments.

The graph 120 in FIG. 7 features an equation, $R^2=0.98$, located at the top of the graph. $R^2$ is a coefficient that specifies how well the parametric equation 124 fit the data points 122. A perfect fit, in which all data points fit the equation exactly, would receive an $R^2$ of 1.00. During analysis, the user 80 inspects $R^2$ to ascertain the confidence in the graph. A graph with a high $R^2$, say 0.90 or greater, would be deemed highly reliable, while a graph with an $R^2$ of 0.70 would warrant greater scrutiny.

In some embodiments, if the $R^2$ coefficient is lower than a pre-specified threshold, the graph is color-coded, such as by changing the background color of the graph. (The pre-specified threshold of $R^2$ may be one of the template parameters, and thus, is adjustable.) This visual warning encourages the user 80 to give additional attention to the graph.

Using the color-coding, the user 80 can inspect the linked graphs document 70, and concentrate on those graphs whose $R^2$ coefficients are relatively smaller. The user can also concentrate on first-in-line graphs, such as the left-most shaded graph 72 of FIG. 4, in which subsequent graphs 82 include dependent parameters.

Template Design

By using the templates 10 as an input to the software 20, the system 100 can be customized in a variety of ways. Because of the speed at which the software 20 executes, multiple analyses may be performed in relatively short time periods. Each analysis combines interactive user input to define the material (e.g., lots and wafers) to be analyzed and a template to reference. The template specifies the tests and algorithms to be used in the analysis.

The software 20 generates a number of graphs, to provide visual representations of the data suitable for analysis. Each line in the template 10 specifies a particular graph to be created. For each graph, the following parameters are specified: algorithm, control, inputs, function, filters, datasets, and output.

In Table 1, the parameters used to generate a graph are described, according to some embodiments.

TABLE 1

Graph Generation Parameters

| Parameter | Description | Examples |
|---|---|---|
| algorithm | type of statistical analysis to apply | FindXsGivenYs FindTanXGivenY FindYsGivenXs |
| control | label for output; enables linkage between graphs | control1 control2 |
| input | input to algorithm (numerical or control) | 2, 5, control1, control2 |
| function | order of polynomial, direction | 1 (linear), 2 ($2^{nd}$-order), 3 ($3^{rd}$-order) |

TABLE 1-continued

Graph Generation Parameters

| Parameter | Description | Examples |
|---|---|---|
| filter | filtering algorithms to use | remove outliers, remove three standard deviations from mean |
| dataset | data to be extracted | (A1, B1), (A2, B2), (A3, B3), (A4, B4) |
| output | column name or number to place the output of the graph analysis | VT @ OPT, 5 |

The algorithm parameter specifies the type of statistical analysis that is to be applied to the data, including the desired input/output behavior. Three algorithms are described in conjunction with FIGS. 8A–8C, below.

The control parameter allows the user to specify one or more labels for the value of the one or more outputs generated by the selected algorithm. The labels can be used to specify the inputs of a following graph. An example value is "control1." The control parameter enables linkages between graphs to be established by the software 20.

The input parameter specifies the one or more inputs to be received by the selected algorithm. The input parameter may be a numerical value, such as "2," or may reference a control value, such as "control1." If the input parameter references a control value, the graph associated with the input parameter (child graph) will be linked to the output of a previous (parent) graph. This ensures that, if a user modifies an adjustable parameter of the parent graph, the input on the child graph is simultaneously and automatically modified.

The function parameter specifies the order of polynomial to use in the regression analysis. Regression analysis involves identifying an equation to fit the data points on the graph. A value of "1" means a linear equation is used, a "2" means a second-order polynomial is used, and so on. The function parameter also includes a direction indicator, which is used by the algorithms to determine priority when multiple results to the algorithm are possible. The direction indicator is described in more detail in conjunction with FIGS. 8A and 8B, below.

The filter parameter specifies what filtering algorithms are applied during the analysis. Examples include filtering out only outlier data and filtering out data that is three standard deviations from the mean.

The dataset parameter specifies what sets of data are to be extracted and used for the graph. Typical values would include a series of data sets, such as (A1, B1), (A2, B2), (A3, B3), (A4, B4), indicating that the analysis is to pull four sets of data of parameters A and B that were taken across devices of sizes 1, 2, 3, and 4.

The output parameter specifies where the software should write the results of the analysis. The results are written to a specific table, and the output parameter identifies a particular column (by name or by number) for the results to be written.

Figure 8A:
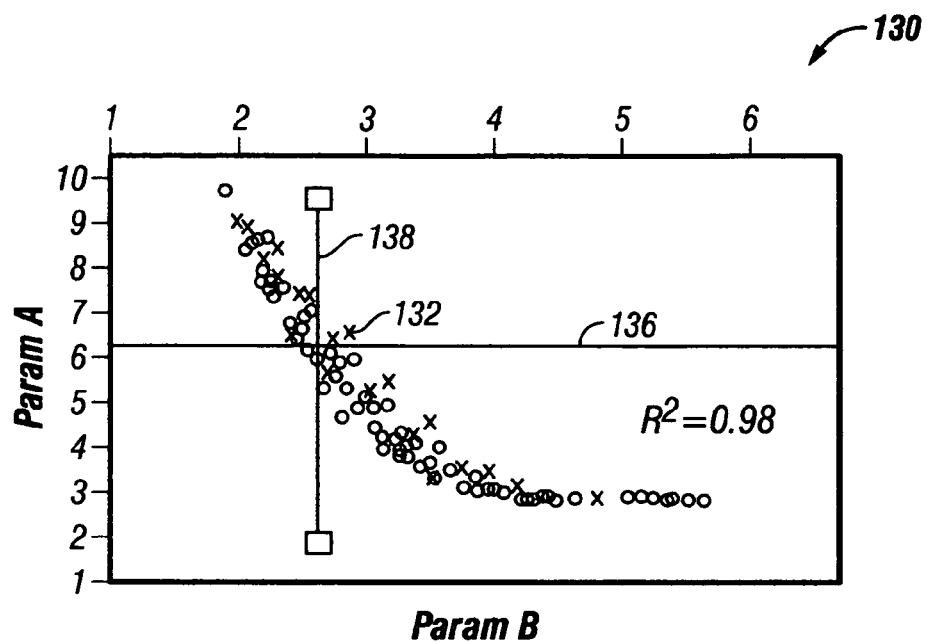
FIGS. 8A–8C are graphs showing the application of three algorithms used by the transistor performance analysis software of FIG. 1, according to some embodiments.
Figure 8B:
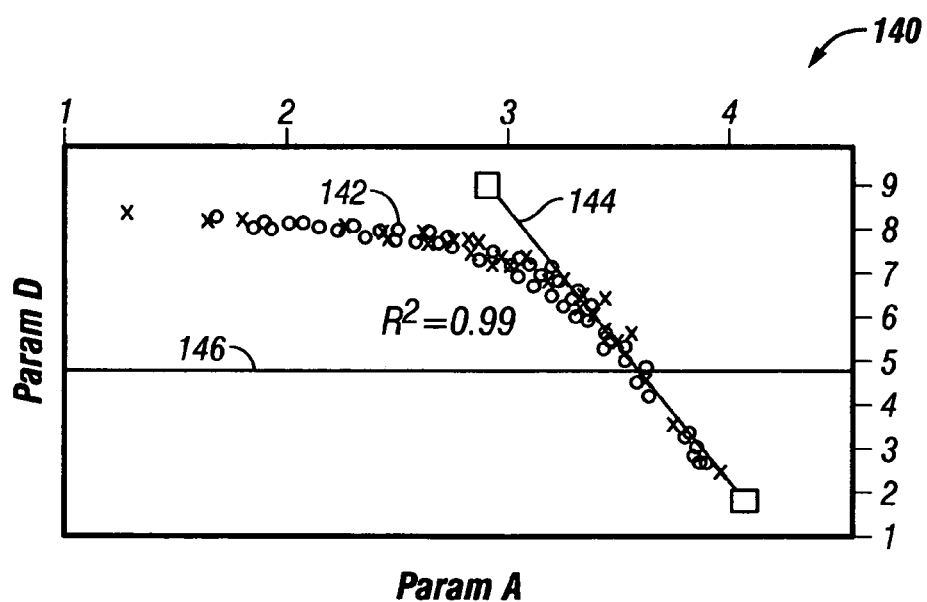
Figure 8C:
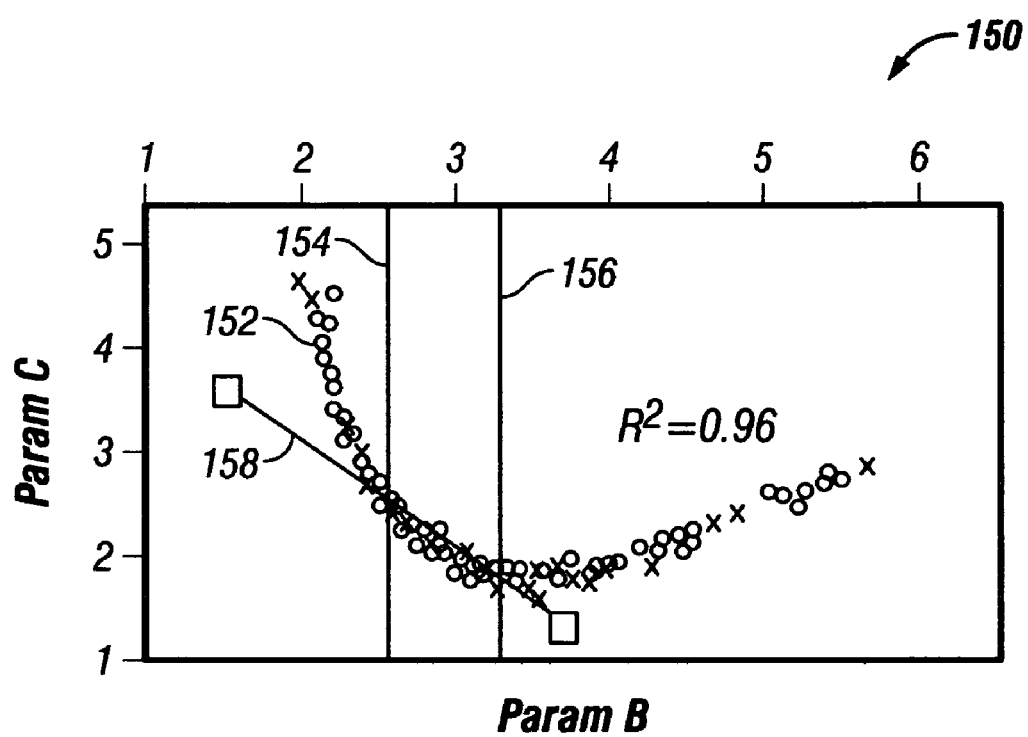

Using the algorithm, control, input, function, filter, dataset, and output parameters, the software 20 is capable of producing a variety of graphs useful to the user 80 in analyzing the transistor data during the process generation. The algorithms used may be specific to transistor analysis. Examples include FindDriveCurrent, which finds the drive current of a transistor, and FindGateVoltage, which finds the gate voltage of a transistor. Alternatively, the algorithms may be more generalized, such as the three algorithms listed in Table 1. FIGS. 8A–8C depict graphs generated using the FindXsGivenYs, FindTanXGivenY, and FindYsGivenXs algorithms, respectively, according to some embodiments.

In FIG. 8A, a graph 130 includes multiple data points 132. (As in FIG. 7, the data points 132 may be represented by a parametric equation.) The FindXsGivenYs algorithm takes a Y value as an input (shown by a horizontal line 136), finds an associated X value from the data points 132, and produces a vertical line (intercept 138) as an output. The user 80 specifies the Y input. The Y input may be either a constant value or a control value (i.e., linked to another graph). The algorithm finds the X value from the data points 132 in the graph 130 and draws the vertical intercept line 138, as shown.

Because of the multiple data points, the direction at which the algorithm sweeps the data points may affect the outcome. Accordingly, the FindXsGivenYs algorithm also uses a direction indicator, as specified in the function parameter of the templates 10. Where the algorithm has no solution, a default value is indicated, and the graph 130 is color-coded.

In FIG. 8B, a graph 140 is depicted, including data points 142. The FindTanXGivenY algorithm takes a Y value as input (horizontal line 146), identifies the corresponding X value, and produces a sloped line 144 tangent to the data points 142 at that location. The Y input may be either a constant value or a control value (i.e., linked to another graph). Again, direction is relevant, as there may be multiple solutions. Direction may be specified in the function parameter of the templates 10. Where no solution is present, the graph 140 is color-coded.

In FIG. 8C, a graph 150 is depicted, including data points 152. The FindYsGivenXs algorithm specifies two X's as inputs, finds the corresponding Y's, then draws a line through the two data points. In the graph 150, two X values, which may be constant values or control values (i.e., linked to another graph) are denoted using vertical lines 154 and 156. The corresponding Y values (there should be only one Y value for each X value) are found, and a sloped line 158 is drawn between the associated data points 152. Using this algorithm, direction is not relevant, thus, the function parameter is not consulted for direction information. The FindYsGivenXs algorithm produces a solution each time.

Manual Adjustment and Plot Linking

Figure 9A:
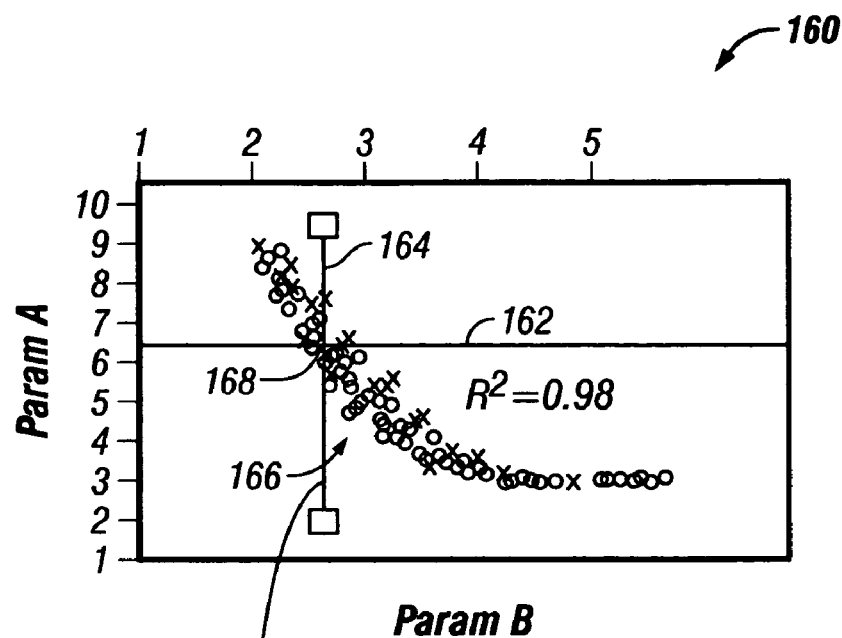
FIGS. 9A and 9B are diagrams showing the linking feature between two graphs produced by the transistor performance analysis software of FIG. 1, according to some embodiments.
Figure 9B:
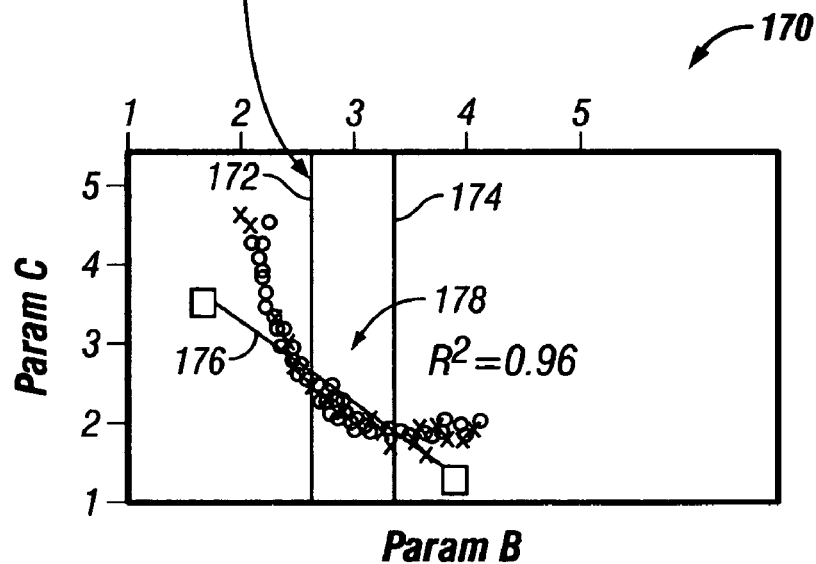

The system 100 thus includes the capability to link graphs together, where appropriate, and to allow manual, interactive adjustment of the graph parameters. FIGS. 9A and 9B illustrate an example of the crossing-graph, linking with manual adjustment capability. Two graphs 160 (FIG. 9A) and 170 (FIG. 9B) are depicted, as shown. The graph 160 uses a FindXsGivenYs algorithm and the second graph 170 uses a FindYsGivenXs algorithm.

In the graph 160, parameter A is plotted against parameter B. Data points 166 are filtered, such as for outlier data points, and regression analysis is performed to fit an equation to the remaining unfiltered data 166. In the graph 170, parameter C is plotted against parameter B. Data points 178 are filtered and regression analysis determines a valid equation for the data points.

A constraint of parameter A is plotted as a horizontal line 162, or reference line, in the graph 160 (FIG. 9A). The FindXsGivenYs algorithm uses the Y value of the horizontal line 162 as its input, finds the corresponding X value in the data points 166 (see intersection point 168), and produces the vertical line 164 as its output. The vertical line 164 can be adjusted manually, and is color-coded to indicate this capability. Given the constraint of parameter A (as indicated by the horizontal line 162), the vertical line 164 indicates the value of parameter B.

The graph 170 (FIG. 9B) also plots parameter B. Thus, the intercept 164 in the graph 160 is automatically linked to the graph 170. The graph 170 plots parameter C versus parameter B. The constraint of parameter B, a vertical line 172, is depicted in the graph 170. The vertical line 172 in the graph 170 has the same value (approximately 2.6) as the vertical line 164 in the graph 160.

A second constraint line 174 is indicated. The second constraint line 174 may be an offset from the first constraint line, such that a range of acceptable values is specified in the graph. The FindYsGivenXs algorithm is invoked, using the constraint lines 172 and 174 (X values) as inputs, to produce the sloped line 176. The intersection of the two constraint lines 172 and 174 with the fitting curve 178 determines the value of parameter C.

The user 80 can modify the adjustable parameter (vertical line 164 in graph 160; sloped line 176 in graph 170) manually. In some embodiments, manually adjustable lines are presented in a unique color relative to other features of the graph. When the output line 164 in the graph 160 is adjusted, the intersection with the data points 166 is changed, changing the parameter B value. The change to the parameter B value is automatically reflected in the graph 170 via the constraint line 172. Once the constraint line 172 changes, the value of parameter C will automatically change.

In some embodiments, the transistor performance analysis software 20 records all key data points (constraints) and formulas (interception) using Excel formulas. The graphs are then plotted against the data. The templates 10 may specify approximately forty linked graphs, each pulling ten data sets, on average (with each set having about twenty data points). In a typical implementation, the software 10 is run against groups of twenty-five wafers, resulting in 1000 linked graphs being generated from a source of 200,000 data points.

In some embodiments, a summary report 74 is produced by the transistor performance analysis software 20 (see FIGS. 1 and 4). The summary report 74 may include a high-level view of each graph, indicating output values following analysis. As an example, for the graph 160 of FIG. 9A, the summary report may state "parameter B at parameter A control value is 2.7" while, for the graph 170, the summary report may state "parameter B, lower bound is 2.5, upper bound is 3.2." This enables the user 80 to obtain a quick synopsis of all parameter values, without having to individually inspect each graph again.

The system 100 compares favorably to prior art analysis, in which scaled down versions of the analysis are completed in several days. For each stage of performance analysis, the testing time is reduced, for a total reduction in operation time from forty hours to twelve minutes, in some embodiments. Table 2 includes a breakdown of the time saved within each stage of the analysis.

TABLE 2

Approximate Time Savings Using Transistor Performance Analysis System

| Innovation | Manual Analysis Time | Automated Execution Time | Total Analysis Time | Savings |
|---|---|---|---|---|
| initial analysis time | 40 hours | 0 hours | 40 hours | |
| automated data extraction & manual curve fitting | 4 hours | 2 hours | 6 hours | 34 hours |
| statistical curve fitting | 30 minutes | 2 hours | 2.5 hours | 3.5 hours |
| customized data analysis engine | 30 minutes | 2 minutes | 32 minutes | 2 hours |
| enhanced filtering & regression | 10 minutes | 2 minutes | 12 minutes | 20 minutes |

Figure 10:
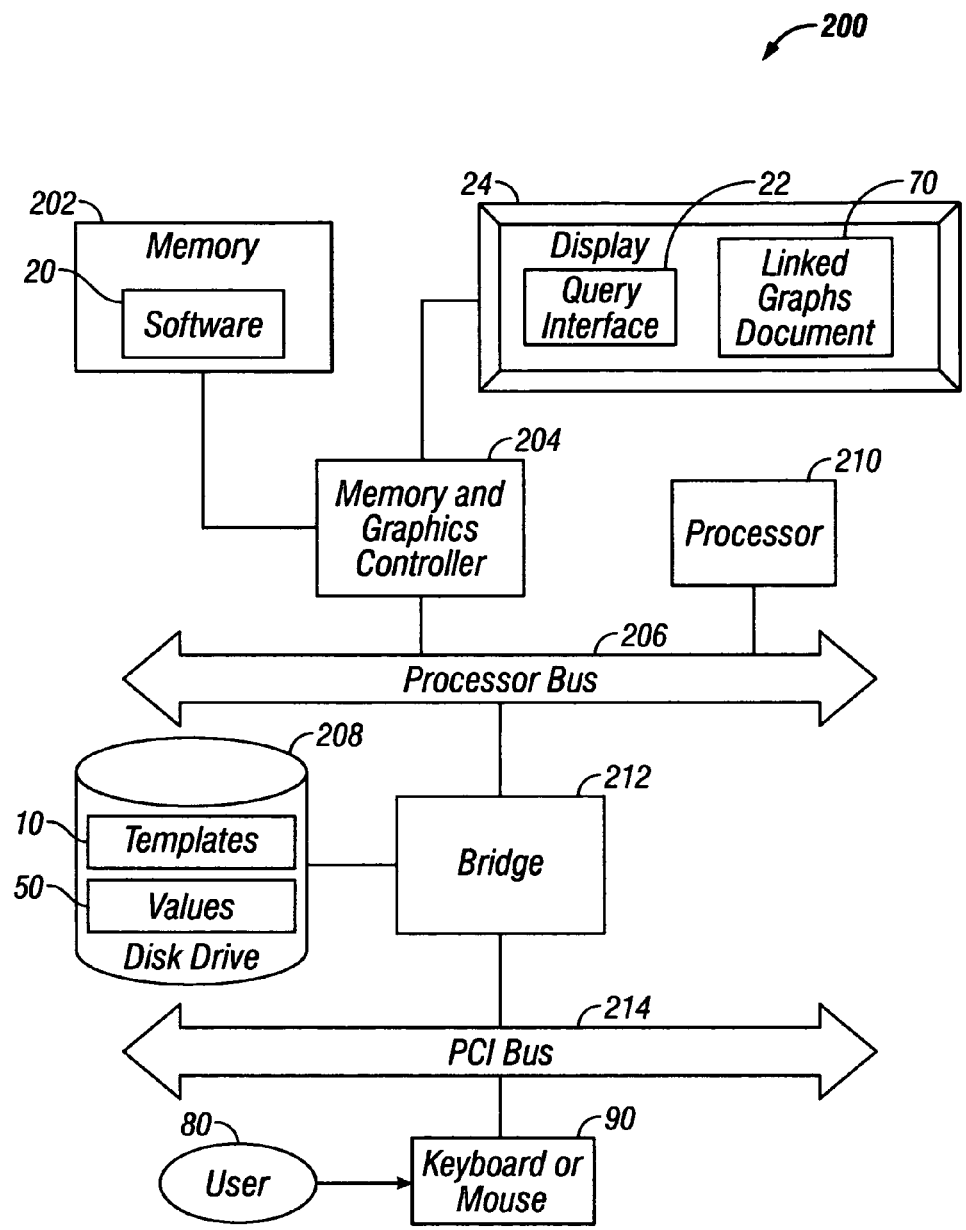
FIG. 10 is a block diagram of a processor-based system environment for using the software program of FIG. 1, according to some embodiments.

The system 100 may be implemented using a processor-based system, according to some embodiments. A typical processor-based system 200 is depicted in FIG. 10. The system 200 represents one of a number of configurations for executing the software 20 of FIG. 1. The processor-based system 200 includes a processor 210 connected to a processor bus 206. A memory and graphics controller 204 supports a memory 202, in which the transistor performance analysis software 20 is loaded, and a display 24, which presents the query interface 22 and the linked graphs document 70 to the user 80. Following automatic and interactive analysis, the summary report 74 (not shown) may also be presented to the display 24.

A bridge 212 sits between the processor bus 206 and a second bus 214, a peripheral component interconnect, or PCI, bus. A disk drive 208 connected to the bridge 212 stores both the templates 10 and the transistor values 50. The disk drive 208 is thus consulted during execution of the software 20. Also connected to the PCI bus 214 is a keyboard or mouse 90, both of which are input devices available to the user 80. The keyboard or mouse 90 may be employed by the user 80 to respond to queries from the query interface 22, interact with the graphs in the linked graphs document 70 produced by the software 20, or update the templates 10.

The system 100 thus provides a streamlined end-to-end application that extracts, correlates, plots, and summarizes the data. A more complete analysis is possible, enabling many more parameters to be included in the analysis than with previous methodologies. The system 100 combines statistical curve fitting with manual interaction, enabling efficient results for clean data. By color-coding certain graphs for further inspection, human judgment can be efficiently and expertly employed.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A software program for analyzing transistors in a material, the software program comprising:
   a first module for producing a plurality of graphs based on a collection of parameters and associated parameter values, the parameters representing characteristics of the transistors, each graph having a plurality of data points, the plurality of graphs further comprising a first graph having an adjustable variable and a second graph having an input variable;
   a second module for producing a linked graphs document, wherein the second module links the second graph to the first graph; and
   a third module for obtaining information from a user about the material in which the transistors are being analyzed;
   wherein the user inspecting the linked graphs document modifies the adjustable variable of the first graph and the software program automatically modifies the input variable of the second graph.

2. The software program of claim 1, wherein the first module further performs filtering on each graph, dividing the plurality of data points into unfiltered and filtered data points.

3. The software program of claim 2, wherein both the unfiltered and the filtered data points are visible to the user during inspection of graphs in the linked graphs document.

4. The software program of claim 2, wherein the unfiltered data points are presented on the graph using a first symbol and the filtered data points are presented on the graph using a second symbol.

5. The software program of claim 3, wherein the first module further performs regression analysis on the plurality of data points within the first graph, such that an equation is fit to the plurality of data points.

6. The software program of claim 5, the equation and the data points having an associated correlation, wherein the first graph further includes a coefficient indicating the accuracy of the correlation.

7. The software program of claim 6, wherein each of the plurality of graphs include a background of a first color, wherein the background of the first graph is changed to a second color when the coefficient is below a predetermined value.

8. The software program of claim 5, wherein the equation is fit using the unfiltered data points.

9. The software program of claim 8, the parameters being obtained from a template, wherein the template specifies the collection of parameters, as well as charting options and algorithms.

10. The software program of claim 9, the algorithms including a first algorithm, wherein the first algorithm automatically produces an output value when the user modifies the adjustable variable of the first graph by plugging the modified adjustable variable into the equation.

11. The software program of claim 10, the collection of parameters further comprising a control parameter, wherein the control parameter is present in the first graph and in the second graph.

12. The software program of claim 9, wherein the template is user-adjustable to specify a different collection of parameters, charting options, and algorithms when a methodology for transistor performance analysis changes.

13. The software program of claim 9, wherein the charting options further comprise including multiple data sets collected from devices of different sizes in one of the plurality of graphs.

14. The software program of claim 9, wherein the charting options further comprise overlaying parameters for a first material on parameters for a second material on one of the plurality of graphs.

15. The software program of claim 9, the collection of parameters each being associated with respective parameter values, wherein the parameter values are empirically obtained during testing of the transistors in the material.

16. The software program of claim 1, wherein the third module presents queries to the user on a display to obtain the information about the material.

17. The software program of claim 1, wherein the second module further produces a summary document specifying parameter values for each of the graphs in the linked graphs document.

18. The software program of claim 1, wherein the adjustable variable is presented in a color distinguishable from other graph features.

19. A method for combining automatic transistor performance analysis with human judgment, comprising:
   producing a plurality of graphs using a template and parameter values, wherein the template specifies characteristics for a plurality of transistors, and the parameter values are empirically obtained;
   establishing linkages between a first graph and a second graph of the plurality of graphs;
   enabling a user to modify an adjustable variable in the first graph based on human judgment;
   obtaining a material selection from the user specifying one of a plurality of materials to be analyzed; and
   automatically updating the second graph.

20. The method of claim 19, further comprising:
   producing a summary report specifying variables for each of the plurality of graphs.

21. The method of claim 19, further comprising:
   filtering the first graph based on one or more transistor parameters specified in the template, to produce filtered data points and unfiltered data points.

22. The method of claim 21, further comprising:
   identifying an equation to represent the unfiltered data points in the first graph.

23. The method of claim 22, further comprising:
   executing an algorithm to automatically update an input variable to the second graph once the adjustable variable in the first graph is modified.

24. The method of claim 22, further comprising:
   associating a coefficient with the first graph, wherein the coefficient specifies how closely the equation fits with the filtered data points.

25. The method of claim 24, further comprising:
   changing a background color of the first graph when the coefficient is smaller than a predetermined value.

26. The method of claim 19, establishing linkages between the first graph and the second graph of the plurality of graphs further comprising specifying a label in the template for the adjustable variable and the input variable.

27. The method of claim 19, further comprising:
   specifying a constraint in the template for the first graph; and
   presenting the constraint as a line visible to the user in the first graph.

28. An article comprising a medium for storing a software program to enable a processor-based system to:
   produce a plurality of graphs using a template and parameter values, wherein the template specifies characteristics for a plurality of transistors, and the parameter values are empirically obtained;
   establish linkages between a first graph and a second graph of the plurality of graphs;

enable a user to modify an adjustable variable in the first graph based on human judgment;

obtain a material selection from the user specifying one of a plurality of materials to be analyzed; and automatically update the second graph.

29. The article of claim 28, further storing a software program to enable a processor-based system to:

produce a summary report specifying variables for each of the plurality of graphs.

30. The article of claim 28, further storing a software program to enable a processor-based system to:

filter the first graph based on one or more transistor parameters specified in the template, to produce filtered data points and unfiltered data points.

31. The article of claim 30, further storing a software program to enable a processor-based system to:

identify an equation to represent the unfiltered data points in the first graph.

32. The article of claim 31, further storing a software program to enable a processor-based system to:

execute an algorithm to automatically update an input variable to the second graph once the adjustable variable in the first graph is modified.

33. The article of claim 31, further storing a software program to enable a processor-based system to:

associate a coefficient with the first graph, wherein the coefficient specifies how closely the equation fits with the filtered data points.

34. The article of claim 33, further storing a software program to enable a processor-based system to:

change a background color of the first graph when the coefficient is smaller than a predetermined value.

35. The article of claim 28, further storing a software program to enable a processor-based system to establish linkages between the first graph and the second graph of the plurality of graphs by specifying a label in the template for the adjustable variable and the input variable.

36. The article of claim 28, further storing a software program to enable a processor-based system to:

specify a constraint in the template for the first graph; and present the constraint as a fine visible to the user in the first graph.

* * * * *